(12) United States Patent
Schwartzmann

(10) Patent No.: US 6,847,094 B2
(45) Date of Patent: Jan. 25, 2005

(54) CONTACT STRUCTURE ON A DEEP REGION FORMED IN A SEMICONDUCTOR SUBSTRATE

(75) Inventor: Thierry Schwartzmann, Le Versoud (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/236,082

(22) Filed: Sep. 6, 2002

(65) Prior Publication Data

US 2003/0042574 A1 Mar. 6, 2003

(30) Foreign Application Priority Data

Sep. 6, 2001 (FR) .............................................. 01 11556

(51) Int. Cl.⁷ .............................................. H01L 29/00
(52) U.S. Cl. ...................... 257/549; 257/154; 257/515; 257/517; 257/526; 257/587
(58) Field of Search .................... 257/119, 126, 257/127, 154, 514, 515, 517, 526, 549, 550, 584, 587, 592

(56) References Cited

U.S. PATENT DOCUMENTS

| | | | | |
|---|---|---|---|---|
| 4,073,054 A | * | 2/1978 | Kaji et al. .................... | 438/359 |
| 4,392,149 A | * | 7/1983 | Horng et al. ................ | 257/518 |
| 4,824,799 A | * | 4/1989 | Komatsu ...................... | 438/348 |
| 4,851,362 A | * | 7/1989 | Suzuki ........................ | 438/348 |
| 5,006,476 A | * | 4/1991 | De Jong et al. ............. | 438/234 |
| 5,323,057 A | * | 6/1994 | Cook et al. .................. | 257/591 |
| 5,399,509 A | * | 3/1995 | Iranmanesh .................. | 438/345 |
| 5,698,890 A | * | 12/1997 | Sato ............................ | 257/592 |
| 5,731,623 A | * | 3/1998 | Ishimaru ...................... | 257/517 |
| 5,869,881 A | * | 2/1999 | Lee et al. .................... | 257/586 |
| 5,962,880 A | * | 10/1999 | Oda et al. .................... | 257/198 |
| 6,184,102 B1 | | 2/2001 | Gris ............................ | 438/365 |
| 6,265,275 B1 | | 7/2001 | Marty et al. ................. | 438/309 |

FOREIGN PATENT DOCUMENTS

| | | | | |
|---|---|---|---|---|
| EP | 0 004 292 A2 | | 10/1979 | |
| JP | 4-105325 | * | 4/1992 | ................. 257/592 |
| JP | 4-209540 | * | 7/1992 | ......... H01L/21/331 |

OTHER PUBLICATIONS

NA9109166, Silicon on Insulator Vertical Complementary Bipolar Device Structure, Sep. 1991, IBM Technical Disclosure Bulletin, vol. 34, Issue 4A, pp. 166–170.*

* cited by examiner

Primary Examiner—George Eckert
(74) Attorney, Agent, or Firm—Lisa K. Jorgenson; Robert Iannucci; Seed IP Law Group PLLC

(57) ABSTRACT

The forming of a contact with a deep region of a first conductivity type formed in a silicon substrate. The contact includes a doped silicon well region of the first conductivity type and an intermediary region connected between the deep layer and the well. This intermediary connection region is located under a trench. The manufacturing method enables forming of vertical devices, in particular fast bipolar transistors.

23 Claims, 4 Drawing Sheets

CONTACT STRUCTURE ON A DEEP REGION FORMED IN A SEMICONDUCTOR SUBSTRATE

BACKGROUND OF THE INVENTION

1. Field of the Invention

The present invention relates to integrated circuits, and more specifically to the forming of a structure of contact with a deep-doped region in a silicon substrate.

2. Description of the Related Art

Certain electronic components forming integrated circuits are formed vertically. Such is the case, for example, for vertical bipolar transistors. The emitter and the base of the vertical bipolar transistor are located at the surface of the silicon wafer. The collector of the bipolar transistor is located in the substrate depth. The connection between the deep collector and the surface interconnections of the integrated circuit must then be performed.

An exemplary implementation of a conventional NPN bipolar transistor of an integrated circuit is given in FIG. 1A.

In a silicon substrate 1 of conductivity type P, ions are locally implanted to create regions 2 of conductivity type N. An epitaxial layer 3 of conductivity type N is then grown above the entire silicon surface. Silicon region 2 then becomes a buried region. As an example, the ions doping substrate 1 are boron ions with a concentration of $1 \times 10^{15}$ at./cm$^3$. The ions doping region 2 are arsenic ions with a concentration of $5 \times 10^{19}$ at./cm$^3$. The ions doping epitaxial layer 3 are phosphorus ions with a concentration of $5 \times 10^{15}$ at./cm$^3$.

Above buried region 2, and inside of layer 3, a bipolar transistor is formed. The bipolar transistor includes a silicon well 5, an intrinsic collector 6, a base 8, and an emitter 9.

Silicon well 5 is a silicon region, of same conductivity type N as region 2, which connects buried region 2 to the wafer surface. Intrinsic collector 6 is a silicon region of the same conductivity type as buried region 2 and is in electric contact therewith due to implanted transition region 7 of the same conductivity type as regions 6 and 2. Base 8 of the bipolar transistor is a silicon region of conductivity type P located at the substrate surface. Base 8 is formed inside of epitaxial layer 3 and is located above intrinsic collector 6. Emitter 9 is a region of conductivity type N, heavily-doped and strictly included in base 8. To laterally insulate the various elements constitutive of the bipolar transistor, trenches 4 filled with oxide are used. Base 8 is thus completely surrounded with trench 4 to be laterally isolated from silicon well 5.

FIG. 1B, which is a top view of FIG. 1A, shows trench 4 completely surrounding base 8 and collector well 5. The other regions of FIG. 1A are not shown, for clarity, on FIG. 1B. The contacting areas on the emitter, the base, and the collector, are not shown in FIG. 1B. Similarly; a possible P well surrounding the bipolar transistor to isolate it from the other integrated circuit elements has not been shown.

The operation of such a transistor is conventional. As long as the voltage between the base 8 and the emitter 9 is not positive, the electrons located in emitter 9 cannot cross the potential barrier generated by the base-emitter junction. As soon as this potential barrier lowers, an electron flow runs from the emitter 9 to the intrinsic collector 6. The electric current thus generated is directed towards the integrated circuit surface to be processed by the other elements of this circuit. The collector current successively runs through transition region 7, buried layer 2, and collector well 5.

It is desired to optimize the bipolar transistor to obtain the highest possible performance. For this purpose, those skilled in the art attempt to decrease the thickness of base 8 and to reduce all internal capacitances and resistances of the device. Constraints due to the technological process limit the reduction of the base thickness. Such is the case, in particular, when the dopants of transition region 7 or of buried region 2 diffuse towards the surface in base 8. The doping level of this base is then uncontrollable. To avoid this phenomenon, the dopant concentrations must be decreased in transition region 7 and in buried layer 2. The distance from these dopant sources to base 8 must also be increased. The internal resistances of the device then strongly increase since the doping levels decrease and the distances to be covered by the current increase. The capacitance between the collector and the substrate of the bipolar transistor must also be optimized to improve the bipolar transistor performances. This capacitance is proportional to the surface of the junction between regions 2 and substrate 1. To improve the performance of the bipolar transistor, the size of region 2 must be reduced without increasing any internal resistance of the device.

The different doping levels and the internal dimensions of the device are more and more difficult to optimize as the design rules determining the minimum dimensions usable for the device decrease.

BRIEF SUMMARY OF THE INVENTION

An embodiment of the present invention provides a decrease of the, internal resistances of a device using a deep-doped region and decrease of the stray capacitance of said deep-doped region, that is, reduction of the dimensions of the deep region.

Another embodiment of the present invention provides an increase of the performances of vertical bipolar transistors.

Another embodiment of the present invention provides a substantially decrease in the manufacturing costs of the devices requiring a contact towards a deep-doped silicon layer.

To achieve these embodiments as well as others, the present invention provides a structure of contact with a deep region of a first conductivity type formed in a semiconductor substrate, including a trench adjacent to the deep region; an intermediary region of the first conductivity type located under the trench and in electric contact with the deep region; and a doped silicon well of the first conductivity type in electric contact with the intermediary region and separate from the deep region.

According to an embodiment of the present invention, the first conductivity type is N; the substrate is single-crystal silicon having conductivity type P; the doping concentration of the deep region is greater than $5 \times 10^{18}$ at./cm$^3$; the doping concentration of the intermediary region is greater than $1 \times 10^{19}$ at./cm$^3$; and the doping concentration of the doped silicon well is greater than $1 \times 10^{19}$ at./cm$^3$.

According to an embodiment of the present invention, the intermediary region partially covers the deep region and the doped silicon well.

According to an embodiment of the present invention, the deep region is laterally bounded, at least in its upper portion, by a trench.

According to an embodiment of the present invention, the deep region, the intermediary region, and the doped well form the contacting area of the collector of a bipolar transistor.

According to an embodiment of the present invention, the deep region forms the deep base of a bipolar transistor and the intermediary region and the doped well form the contacting area on the deep base of the bipolar transistor.

According to an embodiment of the present invention, the deep region is arranged between a cup region of a second conductivity type and the substrate of a second conductivity type to isolate the cup region from the substrate.

The present invention also provides a method for forming a contact with a deep region of a first conductivity type formed in a silicon substrate of a second conductivity type, including the steps of:

etching a trench in the substrate;

implanting at the bottom of the trench a dopant which, after diffusion, will form an intermediary region of a first conductivity type;

filling the trench with at least one dielectric material;

implanting a silicon well of the first conductivity type adjacent to the trench;

implanting with a dopant of the first conductivity type a deep region adjacent to said trench and separate from the doped silicon well; and performing at least one anneal of the structure after at least one of the steps between the first implant and second implant, by diffusion of the dopants implanted under the trench, an intermediary region of the first conductivity type intersecting with the deep region and the well.

According to an embodiment of the present invention, a trench filled with at least one dielectric material delimits the implantation of the dopant of the first conductivity type in the deep region.

According to an embodiment of the present invention, the deep region and the filled trench isolate the initial substrate from the substrate of a second conductivity type of a MOS transistor.

The foregoing objects, features and advantages of the present invention, will be discussed in detail in the following non-limiting description of specific embodiments in connection with the accompanying drawings.

DETAILED DESCRIPTION OF THE INVENTION

In the various drawings, homologous elements are designated with the same references. Further, as usual in the representation of integrated, circuits, the various drawings are not drawn to scale.

Figure 1B:
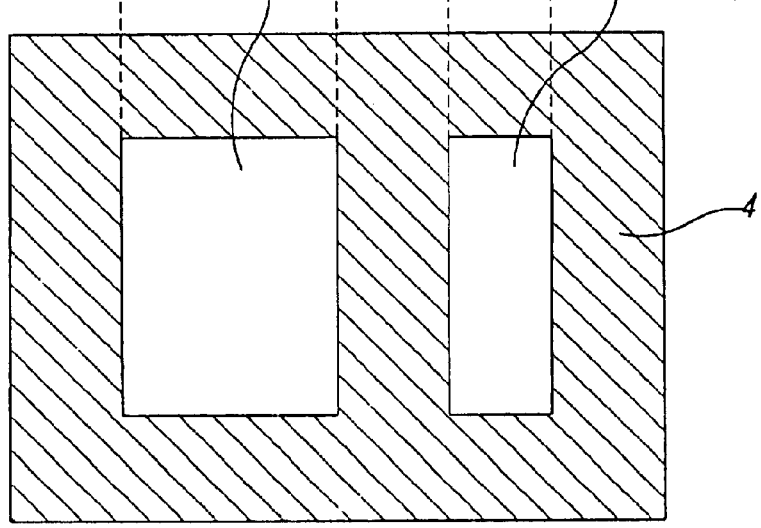
Figure 2:
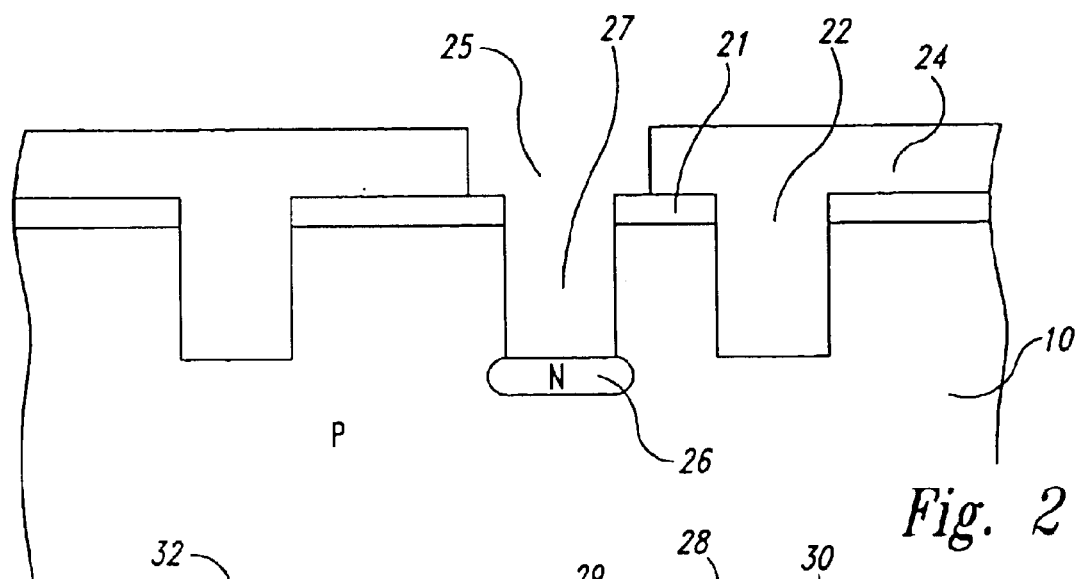
FIGS. 2, 3A, 3B, 4 show successive steps of the manufacturing of a contact structure on a deep region formed in a semiconductor substrate according to the present invention.

FIG. 2 shows an initial step of the forming of a contact structure on a deep region according to the present invention. A protection layer 21, for example, silicon nitride of a 100-nm thickness, is deposited on a P-type silicon substrate 10. Using a photolithography step, layer 21 is etched and trenches are created in the upper part of silicon substrate 10, for example, according to the pattern illustrated in the top view of FIG. 1B. Three trench cross-sections are shown. A resin mask 24 creates an opening 25 right above central trench 27. Arsenic is implanted at a dose smaller than $5 \times 10^{16}$ at./cm$^2$ and with a power smaller than 100 keV through this opening. The arsenic ions are then stopped by resin 24 or layer 21 so that only the bottom of central trench 27 is implanted in a silicon region 26.

Figure 3A:
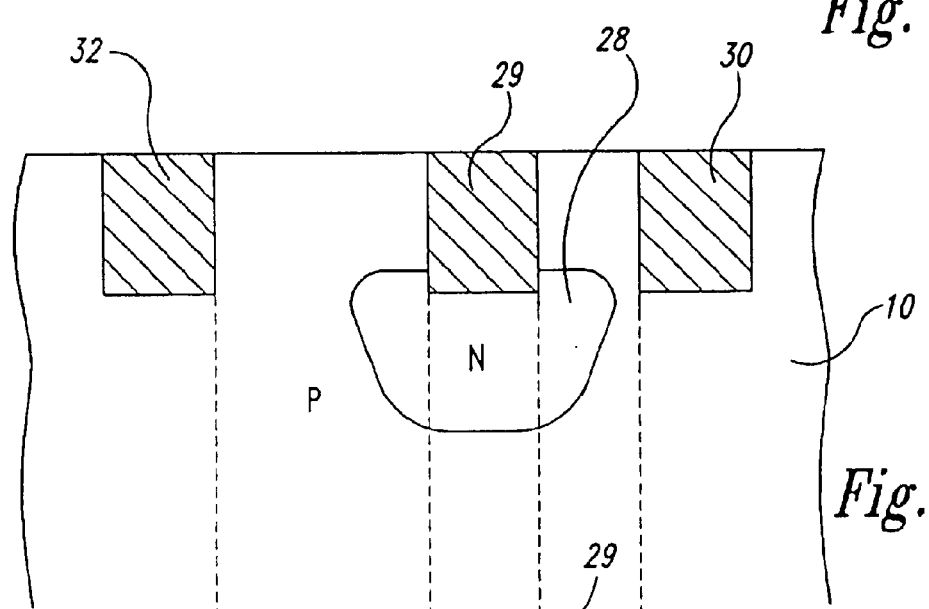
Figure 3B:
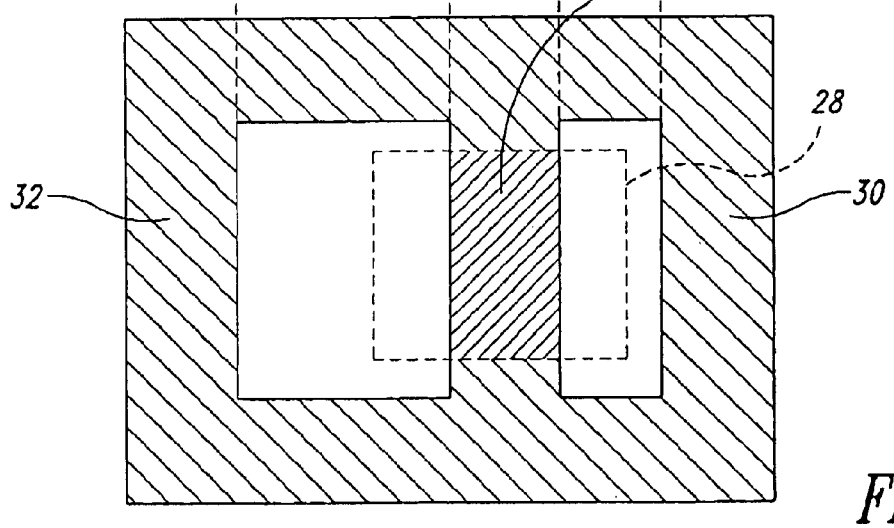

FIGS. 3A and 3B show a next step of the forming of the contact structure on a deep region according to the present invention. FIG. 3A shows a portion of the silicon substrate in cross-section; FIG. 3B shows a portion of the silicon substrate in top view. Resin 24 is removed, and the trenches 29, 30, 32 are conventionally filled with an insulator. A chem-mech polishing and an anneal end the insulating trench creating process. Under the central trench 29, an intermediary N-type silicon 28 is obtained by the diffusion of the dopants, implanted in region 26, during said anneal. For clarity, the filled trenches located above an intermediary region 28 are designated with reference 29 and the filled trenches which are not located above an intermediary region 28 are designated with reference 30, 32. During the anneal process, the dopant of the intermediary region 28 diffuses and contacts the bottom and sidewalls of the insulator; however, the dopant does not diffuse into the insulator. The dopant concentration in intermediary region 28 is highest near the near the bottom and sidewalls of the insulator in trench 29. The dopant concentration of region 28 decreases in proportion to the distance into the substrate 10; thus, forming a dopant profile gradient with highest concentration near the insulator and lowest concentration at increasing distance from the insulator. Alternatively, a substantially constant dopant profile gradient may be formed in region 28. FIG. 3B shows two silicon regions completely surrounded with a trench 29, 30, 32.

Figure 4:
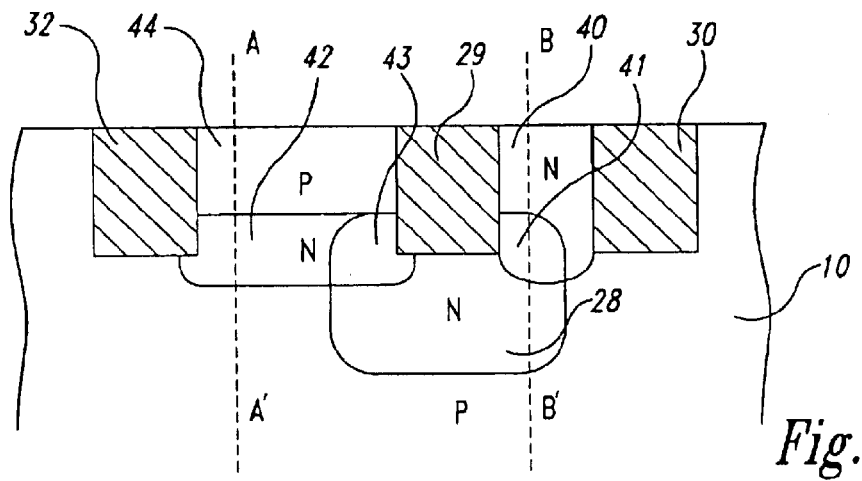

FIG. 4 illustrates a next step of the manufacturing method of the contact structure on a deep region. Phosphorus is implanted at high dose to form a doped silicon well 40 located between central trench 29 and the right-hand trench 30. For example, phosphorus is implanted with a dose between $2 \times 10_{15}$ and $2 \times 10^{16}$ at./cm$^2$ with a 400-keV power. An anneal, for example, at 950° C. for twenty minutes, enables diffusion of this well 40 so that it partially covers intermediary region 28 in a silicon region 41. Silicon well 40 being delimited by trenches, it does not extend laterally; even in case of a significant thermal diffusion of the dopants. Phosphorus is then implanted at high energy in a deep silicon region 42 located between central trench 29 and the left-hand trench. The trenches mask and laterally delimit this deep region 42. For example, phosphorus is implanted with a dose included between $5 \times 10^{14}$ and $2 \times 10^{16}$ at./cm$^2$ with a power greater than 300 keV. A fast anneal, for example at 1,000° C. for 10 seconds, enables electric activation of the implanted phosphorus without causing a significant diffusion. N-type deep region 42 covers a portion of N-type intermediary region 28, previously diffused, in a silicon region 43. Region 42 delimits a P-type silicon cup region 44 delimited by deep region 42, the trenches, and the substrate surface. An optional ionic implantation performed in this cup region 44 enables adjusting the type and level of the doping of cup region 44. If no implantation is performed, cup region 44 has the doping type and level of the initial substrate 10. It is then, in the case of the present example, completely isolated also from P-type substrate 10. Indeed, cup region 44 is vertically isolated by junctions and laterally isolated by the trenches.

Thus, a structure of contact with an N-type deep region 42 formed of an intermediary region 28 and of a doped silicon well 40 has just been formed. An electric contact of small resistance is ensured between the different regions of this structure by the overlapping of regions 28 and 40 in area 41 and of regions 28 and 42 in area 43. Further, the dopant profile of the intermediary region 28 having the high dopant concentration near the insulator and low concentration at increased distances into the substrate 10 creates a decreased resistance path through intermediary region 28 that is partially dependent on the physical dimensions of the bottom of the insulator in trench 29.

Figure 1A:
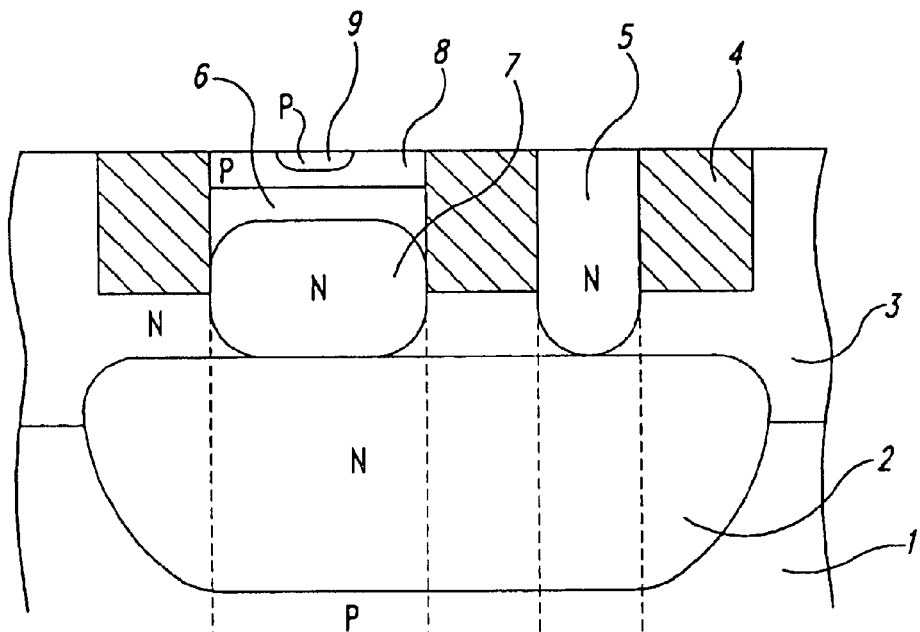
FIGS. 1A and 1B show an NPN transistor formed according to prior art.

The functionalities of regions 42, 28, 40 of FIG. 4 are similar respectively to those of regions 7, 2, 5 of FIG. 1A. Deep region 42 is a transition region for the current. It further has a function of vertical isolation which requires an increase of its doping. Intermediary region 28 has a function similar to that of buried layer 2: it conducts the current from deep region 42 to the doped silicon well 40. However, the dimensions of this intermediary region 28 are very small as compared to those of buried layer 2. The stray capacitances and the resistances associated with this region 28 will also be very small.

The structure of FIG. 4 allows better compromises for the integration of the devices requiring a buried layer. It is not limited when the dimensions of the devices decrease. It is all the more efficient as the dimensions are small, under 0.5 $\mu$m and preferably under 0.1 $\mu$m.

The method is economical since no epitaxy step: which is expensive in industrial conditions, has been used.

The doping profiles obtained by this method are reproducible since they are obtained from limited thermal anneals and ionic implantations. The manufacturing output of integrated circuits is improved.

Figure 5:
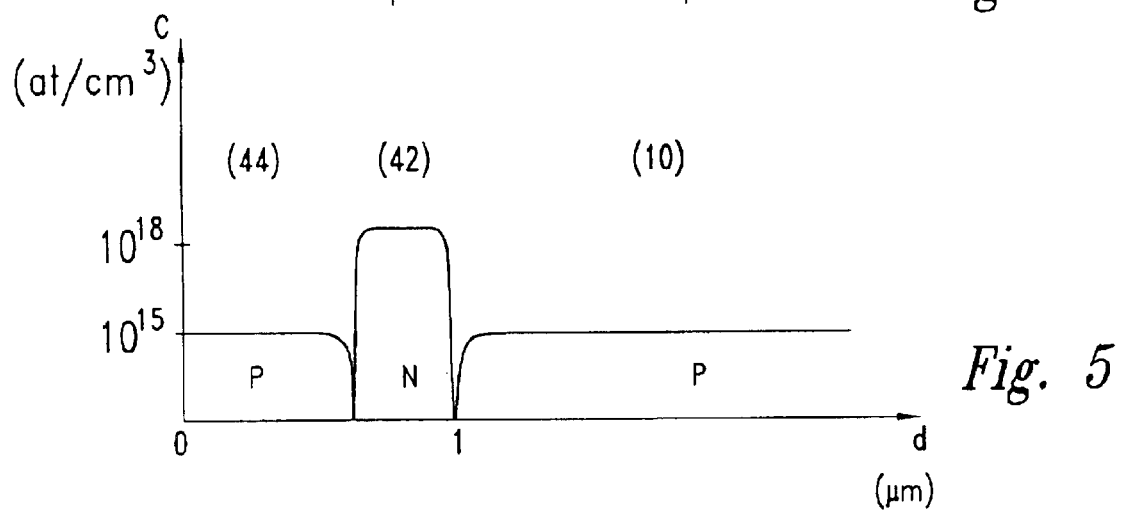
FIGS. 5 and 6 show the doping profiles according to two vertical cross-sections.

FIG. 5 shows the doping profile along vertical axis AA' of FIG. 4. Axis AA' crosses cup region 44 and deep layer 42 perpendicularly to the silicon surface. The abscissa axis represents the depth (d) from the surface of substrate 10, the ordinate axis represents the concentration (c) of dopant atoms according to a logarithmic scale. This doping profile shows the insulation by junctions, in the vertical direction of P-type silicon cup region 44 with respect to P-type substrate 10. To obtain this insulation, the two N/P junctions created between regions 42 and 44 on the one hand and between region 42 and substrate 10 on the other hand must be reverse-biased. A positive voltage must be applied to deep region 42, using intermediary region 28 and well 40.

Figure 6:
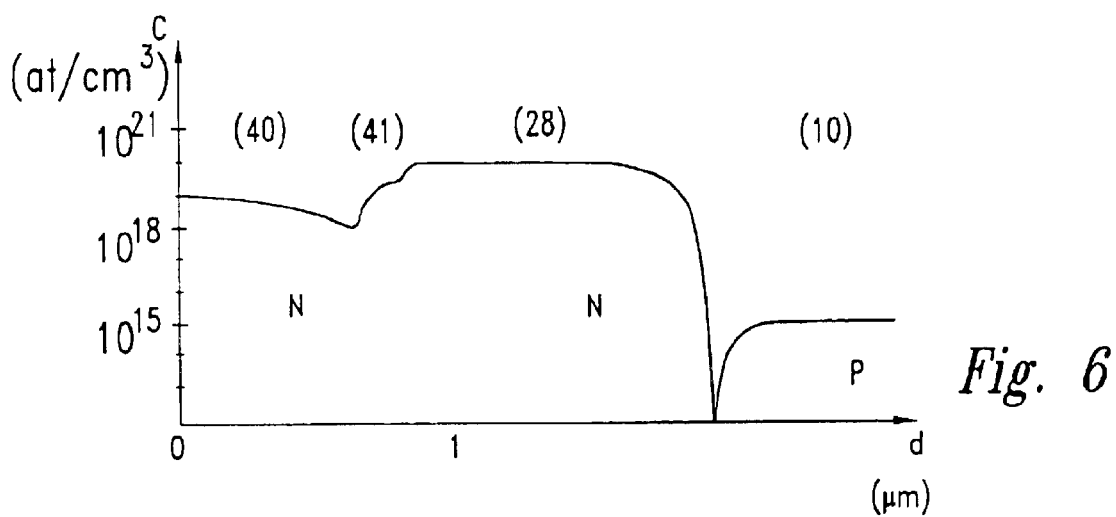

FIG. 6 shows concentration C according to depth d along vertical axis BB' of FIG. 4. Axis BB' crosses doped silicon well 40, region 41, and region 28. This doping profile shows the electric continuity between regions 40 and 28 and in particular the superposition of the concentrations of the dopant atoms of regions 40 and 28 in region 41. This over-concentration of region 41 associated with the small depth of doped well 40 enables obtaining a minimum resistance for the current flow successively crossing regions 40 and 28 in the direction of axis BB'.

Figure 7:
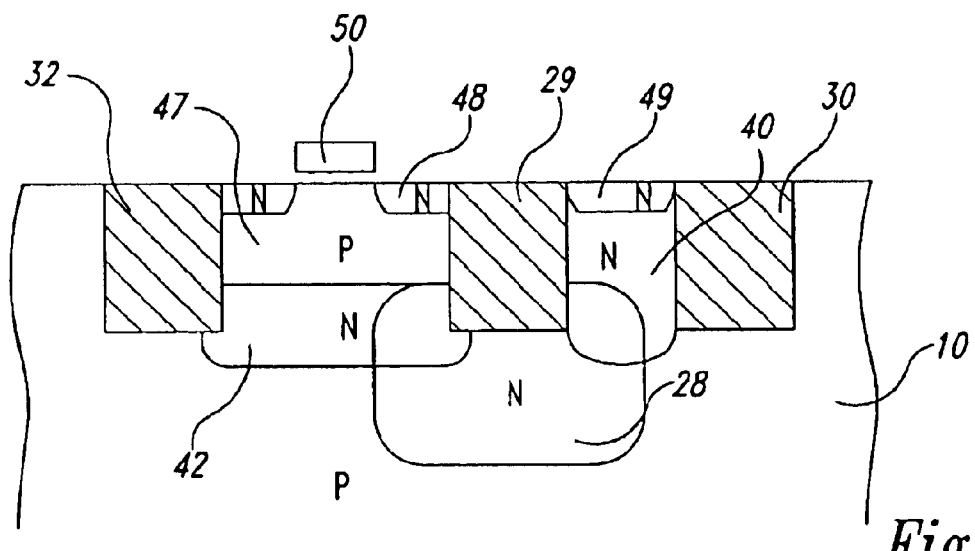
FIG. 7 shows a lateral MOS transistor with an isolated cup region according to the present invention.

FIG. 7 shows the structure of a lateral MOS transistor according to the present invention having a completely isolated cup region 44. Based on the technological operations performed in FIG. 4, an ion implantation of boron is performed in silicon cup region 44 now designated with reference 47. This implantation enables adjusting the doping level of silicon substrate 47 of the future MOS transistor. Conventionally, a gate oxide is grown, polysilicon 50 which forms the gate of the MOS transistor is etched. Source and drain regions 48 of the MOS transistor, as well as surface 49 of doped silicon well 40 are implanted with a strong arsenic dose. Substrate 47 of this MOS transistor is entirely isolated from initial substrate 10 as long as a positive potential differential exists between deep region 42 and the adjacent silicon regions of opposite doping. This configuration known as a triple cup region has been obtained with no significant thermal processing—which is incompatible with submicronic manufacturing processes—and with no growth of an epitaxial silicon layer. The doping level of region 42 enables adjusting the breakdown voltage of substrate 47 with respect to initial substrate 10 and reducing the gain of the parasitic bipolar transistor formed by substrate 47 of the MOS transistor, deep region 42, and initial substrate 10. The parasitic thyristor generated by the sources and drains 48 of the MOS transistor, insulated cup region 47, deep region 42 and substrate 10 also is a significant parameter to optimize this structure. In particular, this parasitic thyristor cannot trigger if the potential of deep region 42 is controlled. For this purpose, the resistance of access to deep region 42 through intermediary region 28 and doped silicon well 40 must be low. The present invention enables easy control of all the physical parameters of regions 49, 40, 28, 42, 47 to optimize this triple cup region structure. The compactness of the obtained structure enables easy integration in digital circuits with a high-integrated density using MOS transistors. This compactness also enables decreasing all the internal parasitic resistances and thus avoiding untimely triggering of parasitic thyristors.

Figure 8:
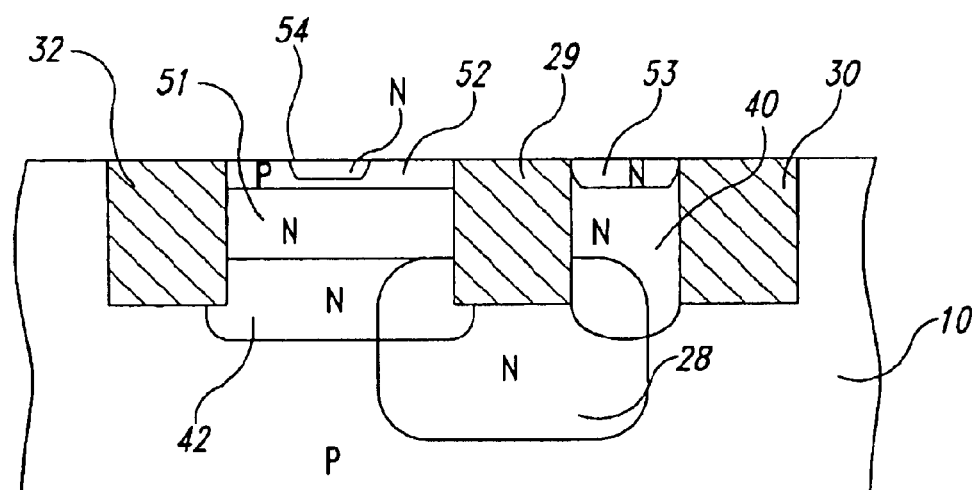
FIG. 8 shows a vertical bipolar transistor of the present invention.

FIG. 8 shows the structure of a bipolar transistor according to the present invention. Based on the technological operations performed in FIG. 4, a phosphorus implantation is performed in region 44. This implantation compensates for the initial P-type doping level of this region and enables locally obtaining a region 51 having an N-type doping. By current operations in bipolar technology, base 52 of the bipolar transistor, contacting area 53 of the collector, and emitter region 54 are then formed. The present invention enables obtaining a low resistance between intrinsic collector 51 of the bipolar transistor and collector contacting area 53. The surface between on the one hand areas 42, 28, 40, and on the other hand, substrate 10 is minimized and limited within the perimeter defined by the trenches 30 surrounding the bipolar transistor. The collector capacitance of the bipolar transistor is low. The two above characteristics enable substantially increasing the dynamic performances of the component, in particular its maximum operating frequency (Fmax) as well as its transition frequency (Ft).

Of course, the present invention is likely to have various alterations, modifications, and improvements which will readily occur to those skilled in the art. In particular, the type of dopant of the different layers as well as the ions implanted to create the doped areas may be changed, according to the embodiments.

Any type of initial substrate may be used as long as there exists a lightly-doped layer at its surface. In particular, epitaxial substrates used in MOS technology are adapted to the present invention. These silicon substrates, very heavily doped in volume, exhibit on their front surface a lightly-doped epitaxial silicon layer with a thickness from 10 to 20 $\mu$m.

The mode of access to deep layers according to the present invention may be used to perform accesses to deep layers of various types forming elements of various components.

Devices of bipolar type may for example be formed with a deep base 42 and with a recovery of the base contact at the surface. These bipolar transistors may be arranged to form thyristor structures.

Any device operating vertically, the current having to be collected in volume, may advantageously be formed based on the present invention.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

What is claimed is:

1. A structure of a contact with a deep region of a first conductivity type formed in a semiconductor substrate, comprising:
    a trench adjacent to the deep region;
    an intermediary region of the first conductivity type located only under the trench and around a bottom of the trench and in electric contact with the deep region; and
    a doped silicon well of the first conductivity type in electric contact with the intermediary region and separate from the deep region, wherein the intermediary region partially overlaps the deep region and the doped silicon well in vertical and horizontal directions.

2. The contact structure of claim 1 wherein:
    the first conductivity type is N;
    the substrate is single-crystal silicon having conductivity type P;
    a doping concentration of the deep region is greater than $5 \times 10^{18}$ at./cm$^3$;
    a doping concentration of the intermediary region is greater than $1 \times 10^{19}$ at./cm$^3$; and
    a doping concentration of the doped silicon well is greater than $1 \times 10^{19}$ at./cm$^3$.

3. The contact structure of claim 1 wherein the deep region, the intermediary region, and the doped well form the contacting area of the collector of a bipolar transistor.

4. The contact structure of claim 1 wherein the deep region forms the deep base of a bipolar transistor and the intermediary region and the doped well form the contacting area on the deep base of the bipolar transistor.

5. The contact structure of claim 1 wherein the deep region is arranged between a cup region of a second conductivity type and the substrate of the second conductivity type to isolate the cup region from the substrate.

6. A structure of a contact with a deep region of a first conductivity type formed in a semiconductor substrate, comprising:
    a trench adjacent to the deep region;
    an intermediary region of the first conductivity type located only under the trench and around a bottom of the trench and in electric contact with the deep region; and
    a doped silicon well of the first conductivity type in electric contact with the intermediary region and separate from the deep region, wherein the deep region is laterally bounded, at an upper portion, by the trench.

7. A contact structure comprising:
    a substrate having a first conductivity type and a first dopant concentration;
    a trench region having a bottom and a side wall in the substrate;
    a well region having a bottom, a second conductivity type, and a second dopant concentration, and positioned laterally of the side wall of the trench region;
    a deep region having a bottom, the second conductivity type, and a third dopant concentration, the deep region positioned laterally of the side wall of the trench and at an opposite side of the trench region with respect to the well region; and
    an intermediate region having the second conductivity type and a fourth dopant concentration, the intermediate region being positioned to contact the bottom of the trench region, and only portions of the bottoms of the deep region and the well region.

8. The contact structure according to claim 7 wherein the second dopant concentration is greater than the first dopant concentration.

9. The contact structure according to claim 7, wherein the second dopant concentration of the well region is greater than $1 \times 10^{19}$ at./cm$^3$.

10. The contact structure according to claim 7 wherein the third dopant concentration is greater than $5 \times 10^{18}$ at./cm$^3$.

11. The contact structure according to claim 7 wherein the fourth dopant concentration is greater than $1 \times 10^{19}$ at./cm$^3$.

12. The contact structure according to claim 11 wherein the fourth dopant concentration has a substantially constant dopant profile gradient extending into the substrate.

13. The contact structure according to claim 12 wherein the first conductivity type is P type and the second conductivity type is N type.

14. The contact structure of claim 7 wherein the intermediate region partially overlaps the well region and the deep region.

15. The structure of claim 7, further comprising:
    a MOS transistor that includes:
        substrate region of the first conductivity type formed in the substrate above the deep region;
        source and drain regions of the second conductivity type formed in the substrate region and separated from each other by a channel portion of tie substrate region; and
        a gate formed above the channel portion of the substrate region, wherein the deep region fully isolates the MOS transistor from a main portion of the substrate.

16. A contact structure comprising:
    a crystalline substrate having a first conductivity type and a first dopant concentration;
    a first region of a dielectric material positioned in the crystalline substrate and having a bottom;
    a second region having a bottom, a second conductivity type, and a second dopant concentration, and being positioned lateral to the first region in the crystalline substrate;
    a third region having a bottom, the second conductivity type, and second dopant concentration, and being positioned below a portion of the crystalline substrate and lateral to the first region; and
    a fourth region having the second conductivity type and second dopant concentration, the fourth region being positioned below and in contact with the entire bottom of the first region, and only portions of the bottoms of the second and third regions.

17. The contact structure according to claim 16 wherein the dielectric material is an oxide.

18. The contact structure according to claim 16 wherein the second, third and fourth regions have dopant concentrations greater than or equal to $1 \times 10^{18}$ at./cm$^3$.

19. The contact structure according to claim 16 wherein the crystalline substrate has a dopant concentration of less than $1 \times 10^{18}$ at./cm$^3$.

20. The contact structure of claim 16 wherein the fourth region partially overlaps the second region and the third region.

21. The structure of claim 16, further comprising:
    a MOS transistor that includes:
        substrate region of the first conductivity type formed in the substrate above the third region;
        source and drain regions of the second conductivity type formed in the substrate region and separated from each other by a channel portion of the substrate region; and
        a gate formed above the channel portion of the substrate region, wherein the third region isolates the MOS transistor from a main portion of the substrate.

22. A structure of a contact with a deep region of a first conductivity type formed in a semiconductor substrate, comprising:
    a trench adjacent to the deep region;
    an intermediary region of the first conductivity type located only under the trench and around a bottom of the trench and in electric contact with the deep region;
    a doped silicon well of the first conductivity type in electric contact with the intermediary region and separate from the deep region; and
    a MOS transistor that includes:
        substrate region of a second conductivity type formed in the substrate above the deep region;
        source and drain regions of the first conductivity type formed in the substrate region and separated from each other by a channel portion of the substrate region, and
        a gate formed above the channel portion of the substrate region, wherein the deep region fully isolates the MOS transistor from a main portion of the substrate having the second conductivity type.

23. A structure of a contact with a deep region of a first conductivity type formed in a semiconductor substrate, comprising:
    a trench adjacent to the deep region;
    an intermediary region of the first conductivity type located only under the trench and around a bottom of the trench and in electric contact with the deep region; and
    a doped silicon well of the first conductivity type in electric contact with the intermediary region and separate from the deep region, wherein the intermediary region extends partially under only portions of the deep region and the doped silicon well.

* * * * *